United States Patent [19]
Lepetit et al.

[11] 4,064,504
[45] Dec. 20, 1977

[54] DIGITAL CODING OF ANGLES

[75] Inventors: Marc Lepetit, Le Housseau Carquefou; Philippe Angelle, Thouare; Jacques Bodin, Corleveau Basse-Goulaine; Dominique du Boisbaudry, Nantes, all of France

[73] Assignee: Societe d'Etudes, Recherches et Constructions Electroniques - SERCEL, Carquefou, France

[21] Appl. No.: 562,082

[22] Filed: Mar. 26, 1975

[30] Foreign Application Priority Data

| Mar. 28, 1974 | France | 74.10828 |
| Mar. 14, 1975 | France | 75.08045 |

[51] Int. Cl.² .............................................. G08C 9/06
[52] U.S. Cl. ........................... 340/347 P; 250/231 SE
[58] Field of Search ........................... 340/347 P, 306; 250/231 SE; 356/141

[56] References Cited
U.S. PATENT DOCUMENTS

| 2,717,987 | 9/1955 | Hagen | 340/347 P |
| 2,730,698 | 1/1956 | Daniels et al. | 340/347 P |
| 2,734,188 | 2/1956 | Jacobs | 340/347 P |
| 2,770,798 | 11/1956 | Roth | 340/347 P |
| 2,775,755 | 12/1956 | Sink | 340/347 P |
| 2,901,170 | 8/1959 | Poole | 340/347 P |
| 3,098,152 | 7/1963 | Von Mathes | 340/347 P |
| 3,461,307 | 8/1969 | Rusling et al. | 340/347 P |
| 3,831,169 | 8/1974 | Raser | 340/347 P |

Primary Examiner—Thomas J. Sloyan
Attorney, Agent, or Firm—Alan H. Levine

[57] ABSTRACT

In a digital angle coder, a revolving disc bears a first series of marks regularly spaced around its axis, capable of being read by two diametrically-opposed fixed heads, and a second series of marks equal in number to the first, regularly spaced around the axis and capable of being read by two diametrically opposed movable heads. Each of the heads includes, for example, a grid reproducing a portion of the series of marks, a photo-emission element and a photo-receiving element. A first auxiliary mark may be read by a fixed auxiliary head and a second auxiliary mark may be read by a movable auxiliary head.

13 Claims, 9 Drawing Figures

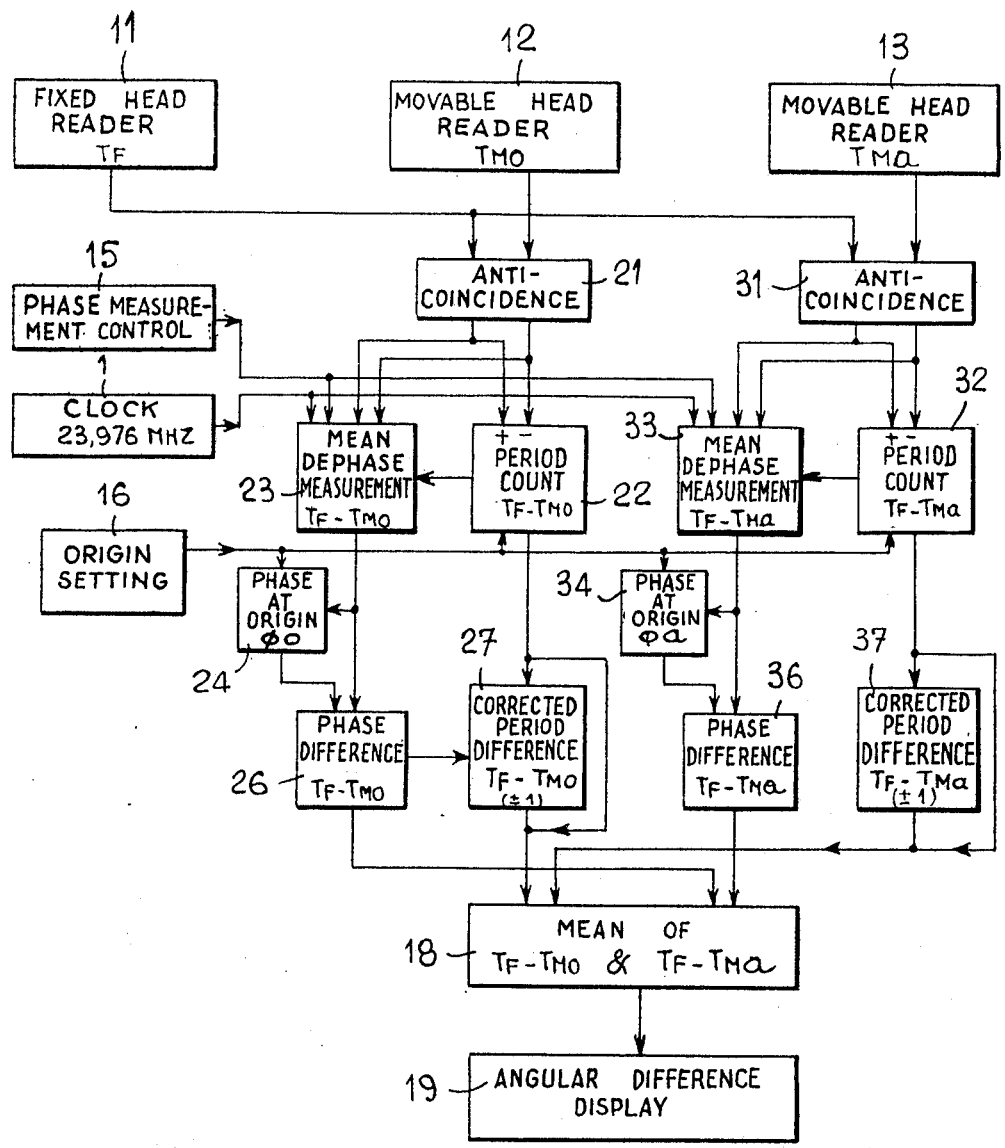

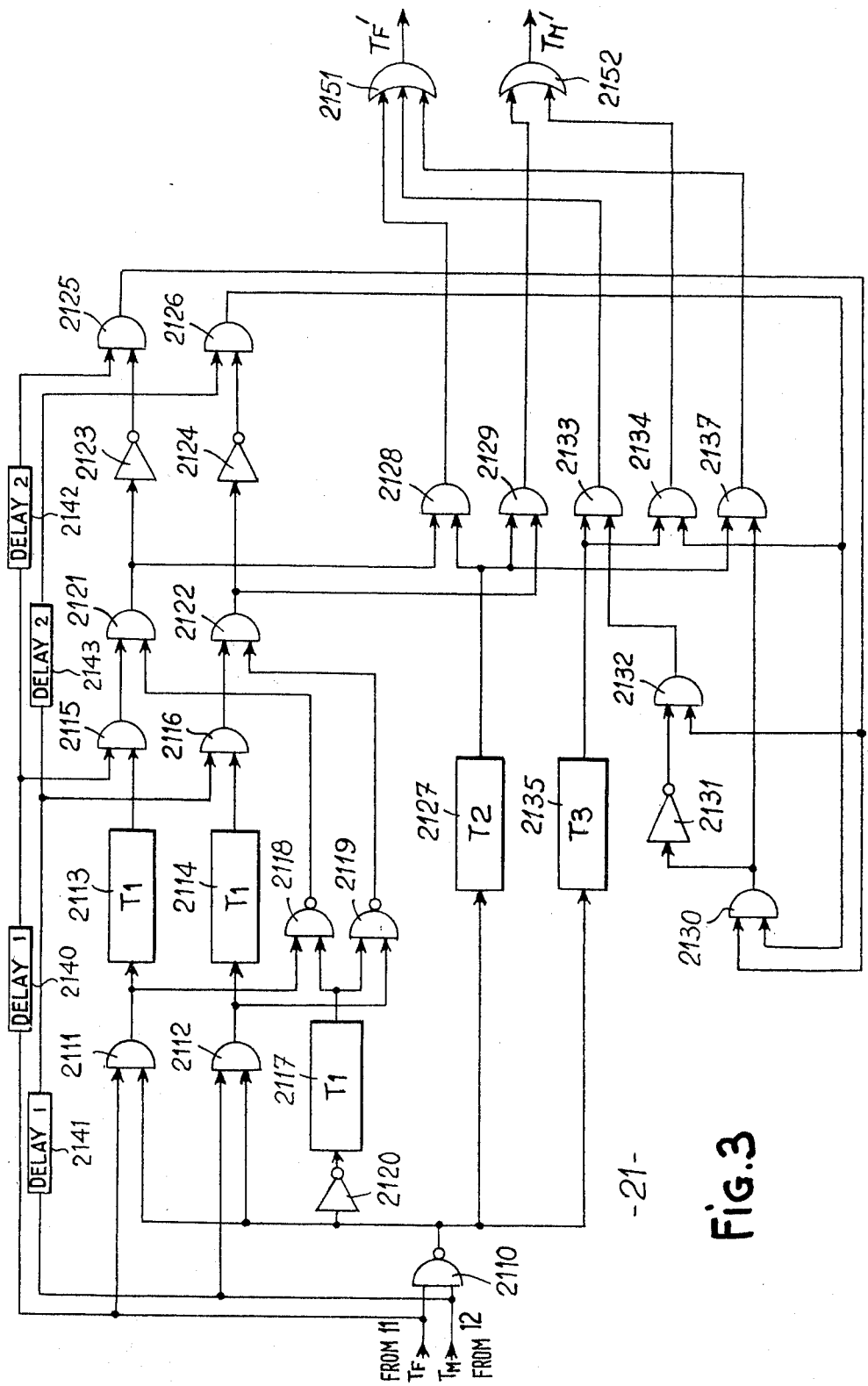

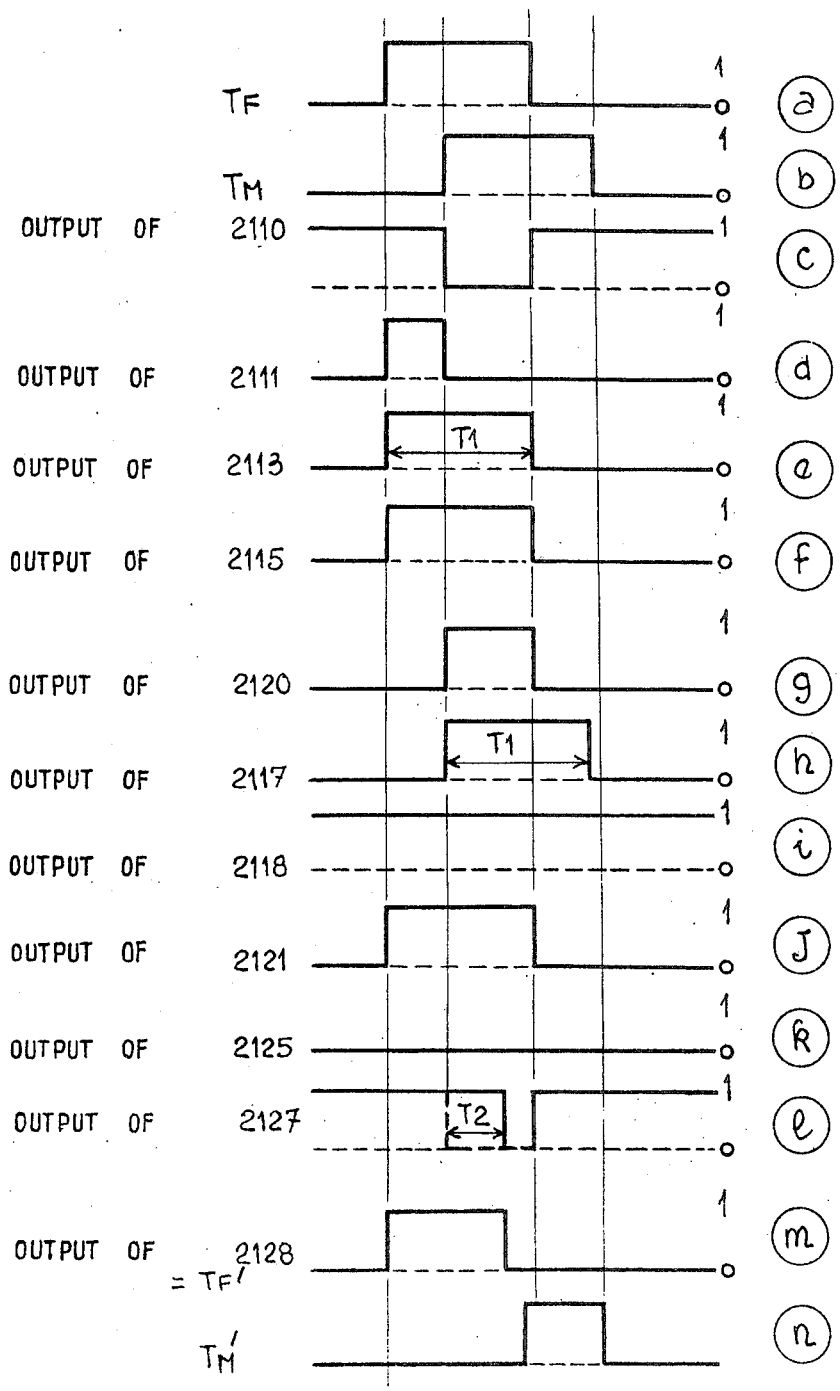

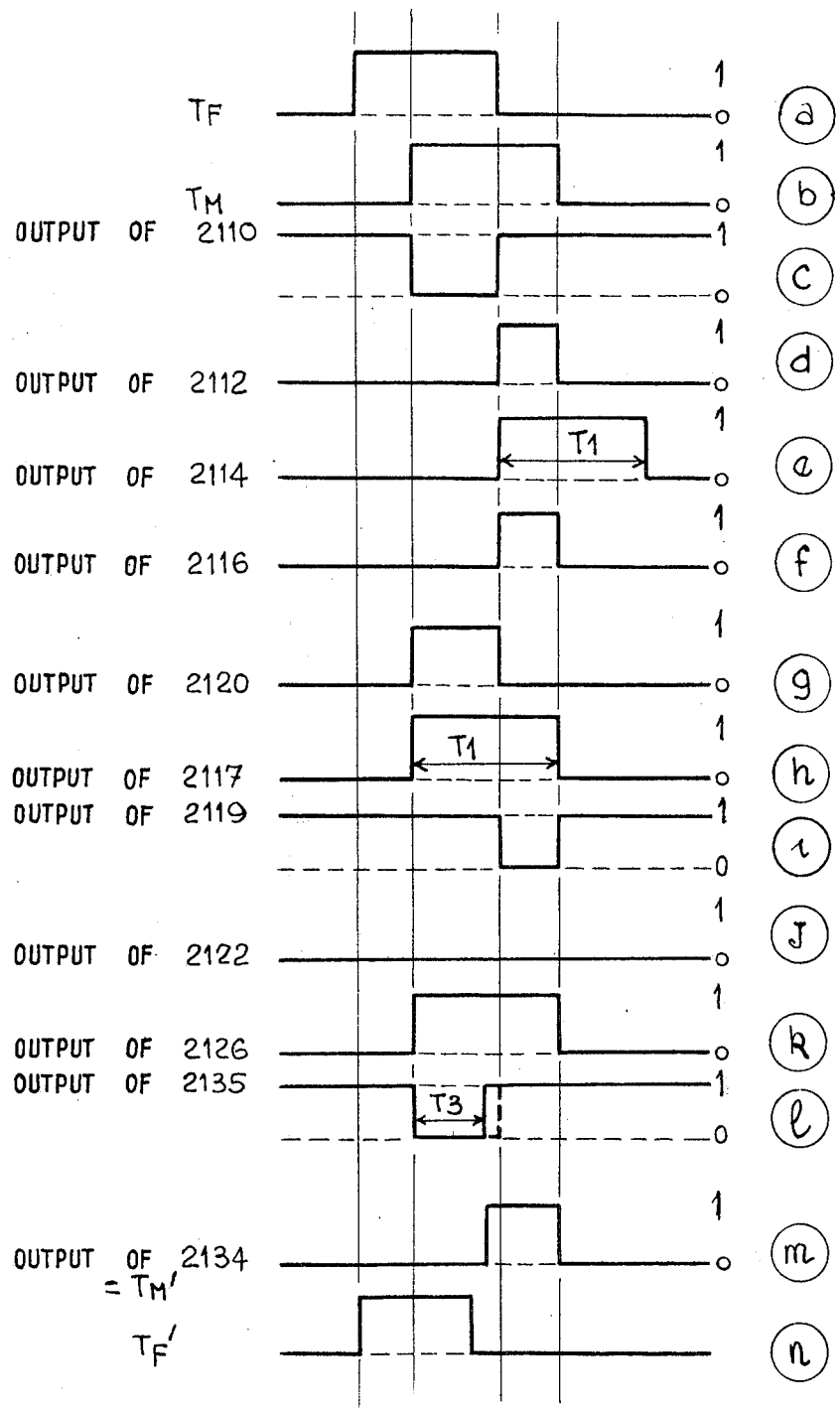

DIGITAL CODING OF ANGLES

The invention relates to the digital coding of angles.

An angle is generally determined from the relative angular position of two indicators about an axis of rotation or of angular displacement. One of the indicators is usually fixed and serves as a reference; the other indicator is movable and defines the angle to be measured in relation to this reference.

In order to carry out coding of such an angle in digital form it has already been proposed to employ an element rotating relative to these two indicators about a second axis. This axis of relative rotation is caused to be as close as possible to the first axis, concerned with the angular displacement.

This relative rotation is applied to at least one third indicator capable of acting in conjunction with each of the first two indicators in such a way that their coincidences with it can be selectively detected. Thus in each complete revolution of the relative rotation, there are obtained separately one coincidence with the fixed indicator and one coincidence with the movable indicator. Determination of the delay between these two coincidences gives information of the magnitude of the angle to be coded.

For example, the first two indicators can be two collecting brushes acting in conjunction with a third indicator constituted by a conducting zone on the periphery of a rotating cylinder. Such a device was described in German Patent No. 595,939.

In this technique, the principal problem is that the precision obtained is related to the precision with which the speed of rotation of the third indicator relative to the other two is known; this speed being usually kept constant.

In order that the invention may be more clearly understood there are considered a first group which contains the first and second indicators associated with the first axis of rotation about which they are in a relative angular displacement, and, on the other hand, a second group which includes at least the third indicator associated with the second axis of rotation, about which it rotates relative to the indicators in the first group.

Each indicator from that one of these two groups which is chosen includes a series of reference marks distributed regularly about the associated axis of rotation, thus defining subdivisions of a complete revolution.

In the case in which the group chosen is the second, the third indicator is preferably supplemented by a fourth indicator, both indicators including a series of reference marks regularly distributed about the axis of relative rotation. The cooperation of these reference marks with the first two indicators thus gives two series of coincidences, respectively, in each relative revolution. The delay between the coincidences of the first series and those of the other series represents the angular displacement to be coded.

In the case in which the group chosen is the first, each of the two first indicators will include a series of reference marks regularly distributed about the axis of angular displacement. The cooperation of these two series of reference marks with the third indicator again gives two series of coincidences, respectively, in each relative revolution. As before, the delay between the coincidences of the one series and those of the other represents the angular displacement to be coded.

For accurate measurement, phase angles or delays are determined between the coincidences of one of these series and the neighbouring coincidence (that is that which follows it in time) of the other of these series, while the first and second indicators are fixed relative to each other. In accordance with the invention, all the phase angles between the coincidences of one series and the neighbouring coincidences of the other series are accumulated over one or more complete relative revolutions. This makes it possible to eliminate the systematic errors which are due to variations in the separation between the reference marks of each series, at the same time as the mean of a large number of measurements decreases the effect of random errors, because the typical error is divided by the square root of the number of measurements.

The invention also relates to devices for the digital coding of angles which generally include a first and a second movable indicator in relative angular displacement about a first axis of rotation and a device producing a relative rotation about a second axis of rotation, substantially coincident with the first, between the first and second indicators and at least one third indicator, which is capable of acting in conjunction with the first and second indicators in such a way as to produce two series of coincidences in each complete revolution which are able to be selectively detected and the dealy between which is related to the said angular displacement; the series of coincidences being produced owing to the fact that each indicator belonging either to the first group associated with the first axis of rotation and including the first and the second indicators, or to the second group associated with the second axis of rotation and comprising at least the third indicator, comprises a series of reference marks regularly distributed about the associated axis of rotation so as to define the subdivisions of one complete revolution.

In accordance with this invention, in a digital coder of angles of this type the means for detection of angles comprises a means for determining the means phase difference and comprising:
- a sanction or authorisation means defining a time window equal to one or to several complete relative revolutions, and
- a means for accumulating all the phase displacements obtained between the coincidences of one of the series and the neighbouring coincidences of the other series over one or several complete revolutions thus defined by the authorisation means.

In one embodiment each series of reference marks constituting an indicator of the chosen group is constituted by a series of marks, for instance which can be read magnetically or optically and supported on a rotating disc, and each indicator of the other group (not chosen) comprises at least one reading head, for example a magnetic or optical reading head. Thus, each series of marks is read by a corresponding reading head, which acts in conjunction with it. The third indicator is divided into two, that is to say a fourth indicator is associated with it. Both of these are constituted by a respective series of marks carried on both sides of the rotating disc or both on the same side. The first and second indicators, the relative angular displacement of which defines the angle to be measured, comprise respectively two reading heads the first of which is fixed and the second of which is movable.

Preferably, another movable head is provided, symmetrical with the first with reference to the axis of angular displacement. This second movable head is employed like the first and with the same series of marks for the whole set of operations constituting the measurement of the delay between the coincidences. By taking the means of the values obtained with the two movable heads, errors due to misalignment between the axis of angular displacement and the axis of relative rotation are compensated. It is, of course, possible to use a large number of movable heads distributed regularly about the axis of angular displacement.

In order to determine the phase displacement between one coincidence of one series and the neighbouring coincidence of the other series, that is to say that which follows immediately, a counter receives a clock frequency during the lapse of time between these coincidences. To obtain this time interval the signals read are, for example, transformed into rectangular or square wave signals and the lapse of time is defined by the interval of time separating homologous transitions of the two rectangular signals. More generally, with two periodic signals the lapse of time can be defined by the time interval between two homologous instants of these signals, or even, more particularly, by correlation.

The digital information finally displayed in the angle coder combines the accurate measurement of angle, brought about as described above by means of the mean delays as detected between two series of coincidences over one or several complete relative revolutions, and a rough measurement which can be brought about in various ways.

In a particular embodiment described in detail below with a magnetic reading means, for example, the authorisation means defining a time window equal to one or several complete relative revolutions is constituted simply by a counter of coincidences of one series up to the number corresponding to one or several complete revolutions. The means for rough measurement is a bidirectional or updown counter which, during the angular displacement between the first indicator and the second indicator, counts the difference between the number of coincidences appearing in one of the two series of coincidences (first indicator) and the number of coincidences appearing in the other of the two series of coincidences (second indicator). Driving of the disc is brought about by means of a motor, the speed of rotation of which is related to the frequency of the counter clock, the disc being, for example, coupled in rotation to a synchronous motor controlled from the clock in such a way that a whole number of clock periods elapse during one complete revolution of the disc.

In a preferential variant greater precision is achieved as well as greater simplicity by comparison with the preceding embodiment.

According to a first aspect of this variant, the first group of indicators of the coder also comprises two auxiliary indicators associated, respectively, with the first and second indicators, and the second group of indicators comprises in addition at least one other auxiliary indicator, associated with the third indicator; each auxiliary indicator of the first group acting in conjunction with an auxiliary indicator of the second group to produce one coincidence per revolution.

The authorisation means may thus simply comprise one or several bistables (flip-flops) coupled to one of the auxiliary indicators so as to change state at each revolution and, by means of these changes of state, to define a time window equal to one or several complete relative revolutions. The means of rough measurement simple employs the delay between the coincidences, in each revolution, of the two auxiliary indicators of the first group, respectively, and one auxiliary indicator of the second group.

According to a second aspect, the clock of the digital angle coder is able to be enslaved in phase and a means of enslavement is coupled to one of the indicators to enslave said clock according to the rhythm of revolution of the disc; said relative rotation taking place at a substantially constant speed.

According to a third aspect, in the non-chosen group of indicators, both the first indicator and the second indicator comprise, in a sub-divided manner, two reading heads mounted substantially symmetrically with respect to the first axis of rotation. The second group of indicators being constituted by two series of marks regularly distributed and of equal number, the first of these two series of marks is read by the two reading heads of the first indicator, while the second series of marks is read by the two reading heads of the second indicator.

According to a fourth aspect of the preferred variant, that one of the groups of indicators which is said to be chosen comprises a disc of a material of low reflectivity carrying both series of reference marks in the form of a series of reflecting marks regularly distributed round said disc and bearing one mark per revolution for each auxiliary indicator; the other group of indicators (said to be not chosen) comprises one or several reading heads capable of reading each series of marks and at least one auxiliary reading head of a type able to read said one mark per revolution; the reading heads are advantageously optical reading heads, each constituted by a grid corresponding to the marks to be read, as well as a photo-emitting cell and a photoreceiving cell mounted so as to detect coincidence of the grid and the marks, the photo-emitting cell and the photoreceiving cell being advantageously mounted on the same side of the grid for detection by reflection. When concerned with the series of marks distributed round the disc, the grid can be constituted as practically identical with a portion of this series of marks, and may, for instance, correspond to a sector of the disc measuring one hundredth of a revolution; when concerned with one mark per revolution the grid may be constituted by a narrow transparent interval.

While the first aspect as described above allows, in particular, a simplification in the embodiment of the coder, the other aspects mainly concern improvements in its precision.

The invention will now be described in more detail, by way of example, with reference to the accompanying drawings, in which:

FIG. 2 illustrates the circuit diagram of the electronic part of the angular coder of FIG. 1;

FIG. 3 illustrates the detailed circuit diagram of the anti-coincidence circuit 21 of FIG. 2, and FIGS. 3A and 3B are time diagrams relating to this circuit;

Figure 5:
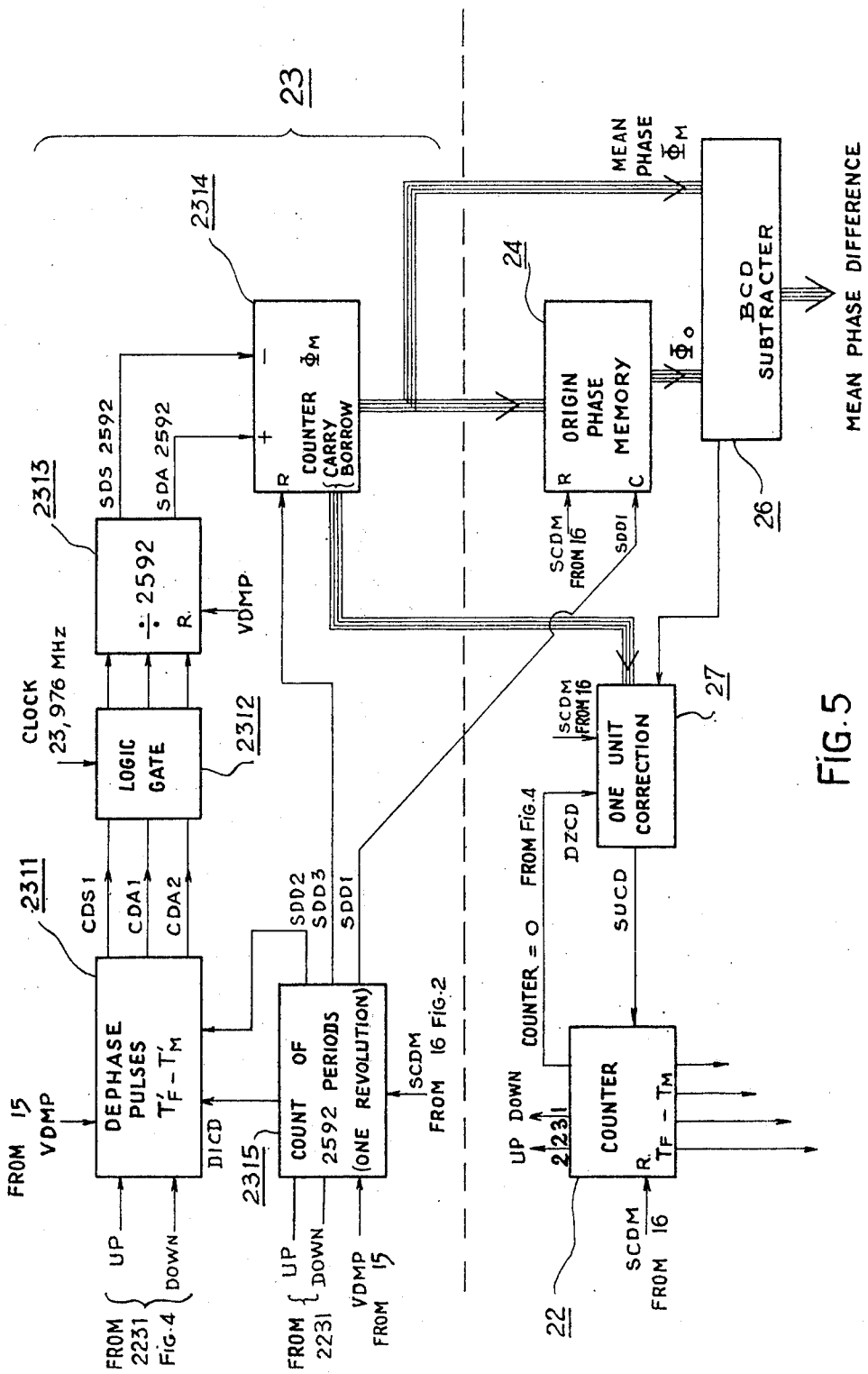
Figure 6:
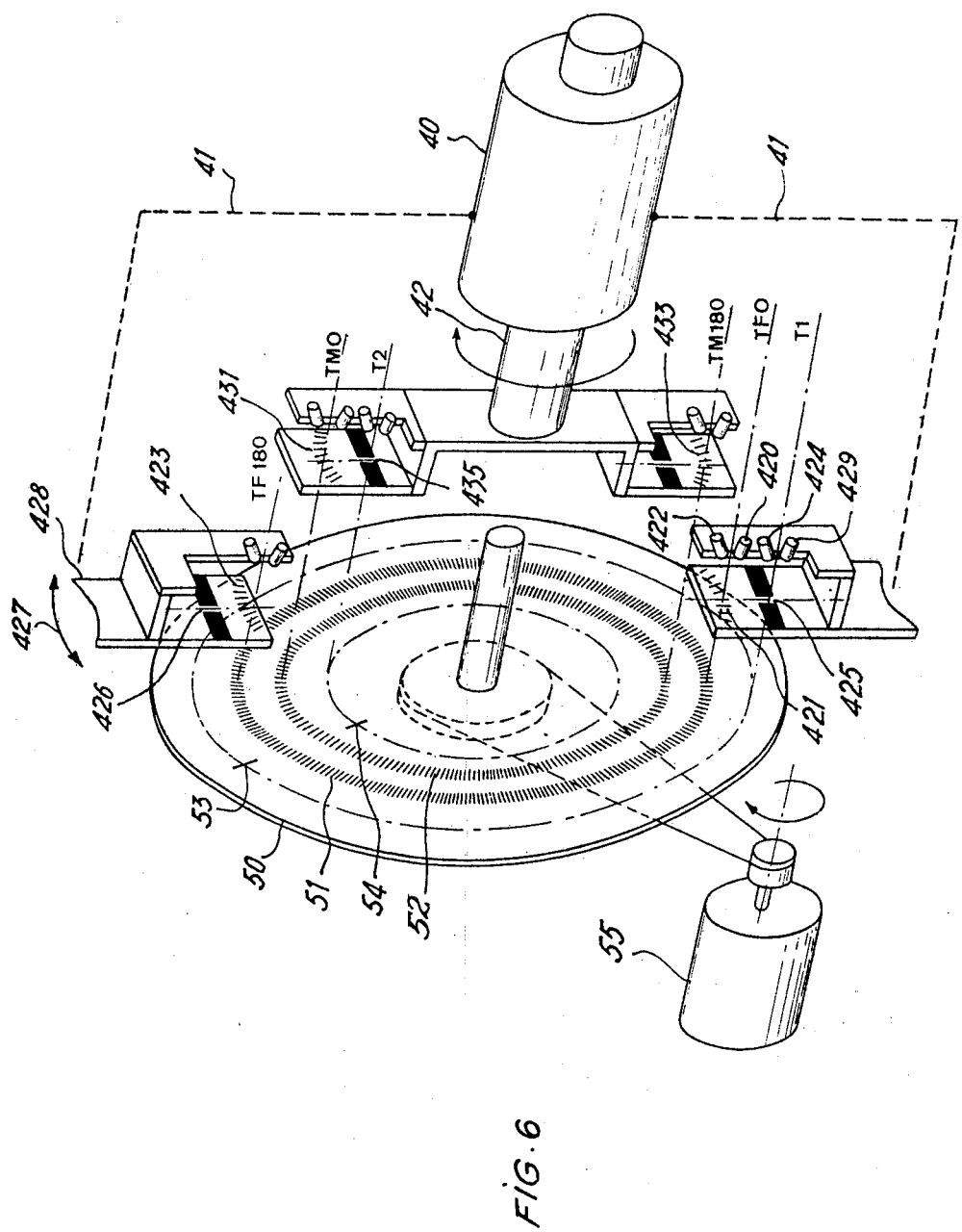
Figure 7:
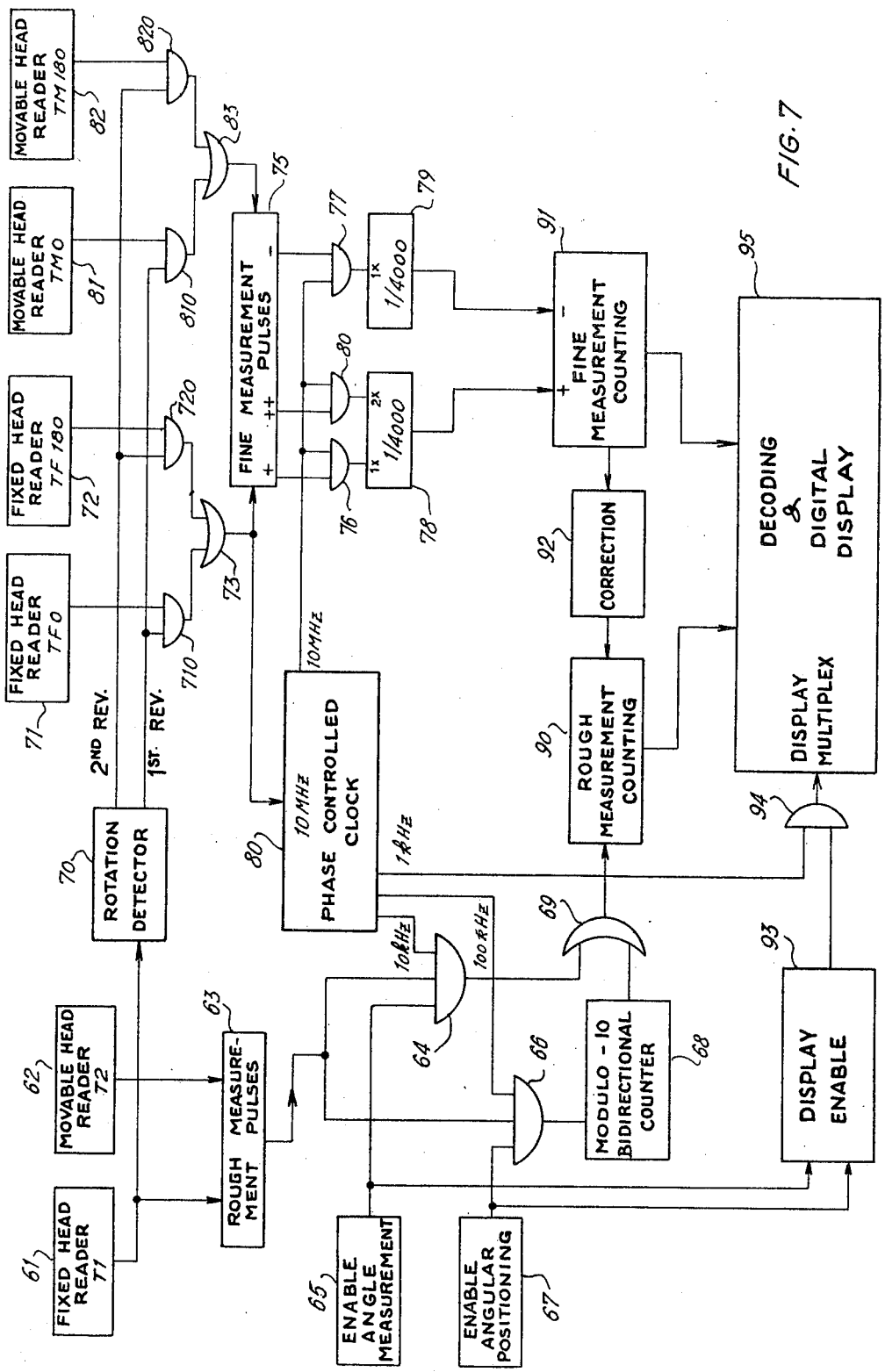

FIG. 5 is a circuit diagram, in partial detail, of the circuit 23 for measurement of the mean phase displacement of FIG. 2, with counting circuits 22, circuit 24 for memory of phase at the origin, circuit 26 for measurement of phase interval, and circuit 27 for correction by one unit 27;

FIG. 6 illustrates in schematic form, in an exploded perspective view, the physical elements of a preferred embodiment of the angle coder; and FIG. 7 is the fundamental circuit diagram of the electronic circuits which allow measurements of angle in the coder of FIG. 6.

Figure 1:
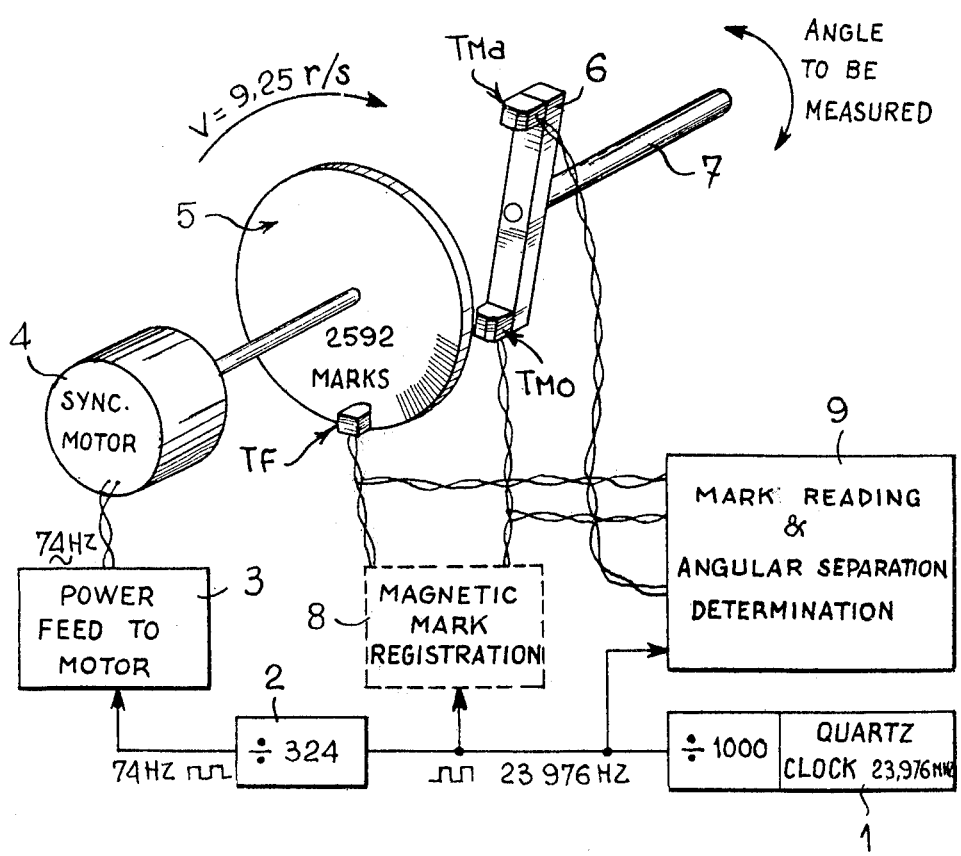
FIG. 1 is an explanatory diagram illustrating one particular method and angular coder embodying the invention.

In FIG. 1 a quartz clock 1 of frequency 23.976 MHz, supplies after division of the frequency by 1000, a frequency 23.976 kHz.

This frequency is applied in particular to a circuit 2 for dividing the frequency by 324 (for example a digital counter) the output of which supplies a frequency of 74 Hz.

This frequency is applied to a circuit 3, which is the power feed of a synchronous motor 4 having, for example, 8 poles. This synchronous motor may be of the polymotor type No. 9 904 110 09601 or 9 904 110 09611, according to the desired sense of the rotation, these motors being sold by Société d'Etude et de Développement d'Appareils ElectroMecanigues, S E D E L E M, of France. With 8 pairs of poles, this motor rotates at the speed 74/8 = 9.25 revolutions per second, or 555 r.p.m.

This synchronous motor is coupled directly to a disc 5 which it drives at the same speed. The disc 5 is a magnetic disc with an external diameter of 18 mm. This magnetic disc is obtained by cutting out from an aluminium plate with a magnetisable coating of iron oxide $Fe_2O_3$ on both faces, of the type used by manufacturers of magnetic discs for computers.

A magnetic head $R_F$ which is of the writing-reading type is arranged on one side of the disc 5. The magnetic head $T_F$ is orientated in such a way that its air-gap is radial with respect to the disc 5. It is mounted in such a way as to define on the disc 5 a magnetic track with a median diameter of 13 mm. The speed of displacement of the disc below the head is thus 380 mm/second.

The magnetic head $T_F$ is maintained at a small distance from the disc (several microns), preferably by causing said head to fly on a fluid entrained by the rotation of the disc. This fluid may, for example, be the surrounding air, or else an oil of low viscosity. For this purpose, the magnetic head itself is of very small dimensions, of the order of a millimeter. In order to lift it, there is attached to it a wing which allows it to fly above the magnetic disc 5, in a manner known in itself. Suitable flying magnetic heads can be supplied by APPLIED MAGNETICS, California, United States of America.

In the same way as the fixed magnetic head $T_F$ and on the other side of the disc a movable head $T_{Mo}$ and a movable head $T_{Ma}$ are arranged (for the sake of clarity these two movable heads have been moved away from the disc 5 in FIG. 1). The two movable heads are carried on an arm 6 fixed on to a movable shaft 7 rotating about an axis of angular displacement. This axis of angular displacement is aligned as closely as possible with the axis of rotation of the disc 5.

A coupling is provided to the magnetic head $T_F$ as well as to the magnetic head $T_{Mo}$ with the object of coupling them to a circuit for the registration of the magnetic marks 8, with coupling receives by another route the clock frequency equal to 23.976 kHz.

Advantageously, registration is carried out once and for all in the factory and the circuit 8 does not form part of the commercially available angle coder. For this reason it is shown within a box of dashed lines.

For this registration the synchronous motor 4 is caused to rotate at a speed of 9.25 revolutions per second, defined by the quartz clock 1. A registration circuit 8 of known type is used to feed the magnetic heads $T_F$ and $T_{Mo}$ at the frequency 23,976 Hz. These signals may be rectangular signals, of which it is known that subsequent reading gives sinusoidal signals in the case of high density registration.

The operation of registration lasts for one revolution of the disc. During this operation the heads $T_F$ and $T_{Mo}$ are kept absolutely fixed relative to each other.

In this way the magnetic head $T_F$ and the magnetic head $T_{Mo}$, respectively, inscribe on one side of the disc 5 and on the other side two magnetic tracks comprising 2592 periods or marks in one complete revolution of the disc 5. Each period is equal to 500 seconds of angle, at a diameter of the order of 13 mm.

The heads are preferably clamped exactly opposite to one another. In this way two identical inscribed tracks are obtained which are symmetrical on the two sides of the magnetic disc.

The inscription may be of any type which allows precise instants to be supplied on reading, which are termed "coincidences" both in order to define the subdivisions to be counted and in order to permit the determination of phase displacements.

It should be remarked in this connection that to obtain coincidences does not necessarily require the brutal, short, and precise phenomenon which the word "coincidence" itself suggests. The registration of periodic inscriptions of period equal to (or a submultiple of) that of the subdivisions allows, without necessarily employing brutal transitions, the coincidences to be reconstituted. Thus every time two indicators pass in front of each other there is a coincidence.

Thus, a first group comprises a first indicator constituted by the head $T_F$ and a second indicator constituted by the magnetic head $T_{Mo}$ with which is associated a second supplementary indicator constituted by the magnetic head $T_{Ma}$. The second indicator and its supplementary indicator are arranged symmetrically with respect to the axis of angular displacement of the shaft 7.

Forming a second group, the disc 5 has on its two faces a third and a fourth indicator constituted by the inscriptions or marks registered on the two magnetic tracks. In this connection it should be remarked that if the fixed head does not interfere with the movement of the movable head, it is possible to employ one magnetic track only by placing both these heads on the same side of the disc. The indicators are thus seen to be physical elements capable of indicating or defining a position.

The disc 5 (second group) is rotated relative to the magnetic heads (first group) by means of the synchronous motor 4.

Reading the two magnetic tracks, the heads $T_F$ and $T_{Mo}$ will give coincidences, for example at transitions in the same direction of the square wave signals registered, or again at passages in the same direction through their mean value by the sinusoidal signals.

Each magnetic head will thus read one series of coincidences during one complete revolution of the disc 5, and so on in a repetitive manner. The auxiliary magnetic head $T_{Ma}$ reads the same track as the movable head $T_{Mo}$ which has registered this track. Taking this fact into account and using the mean of the readings of the mobile heads $T_{Mo}$ and $T_{Ma}$, misalignment of the axis of angular displacement of these heads with respect to the axis of rotation of the disc 5 is compensated.

The three magnetic heads $T_F$, $T_{Mo}$ and $T_{Ma}$ are coupled to a circuit 9 performing the reading and the measurement of the angular separation. This circuit 9 will now be described in detail with reference to the following Figures.

In FIG. 2, the magnetic head $T_F$ is connected to a reading amplifier 11, while the magnetic heads $T_{Mo}$ and $T_{Ma}$ are connected, respectively, to two other reading amplifiers 12 and 13, identical with the first.

Each of these reading amplifiers comprises first of all a limiting amplifier, transforming the substantially sinusoidal signals into practically square wave signals. These latter are then differentiated and formed in such a way as to give a pulse of a chosen duration for each of the transitions of the square waves in the same direction, for example the upward direction.

The pulses of circuit 12 ($T_{Mo}$) and the pulses of circuit 11 ($T_F$) are applied to an anti-coincidence circuit 21. This circuit has as its function the separation of two pulses arriving simultaneously at these two heads, which may occur.

The two outputs $T_F$, and $T_{Mo}$, of the anti-coincidence circuit 21 are applied to two inputs of the reversible counting circuit 22 which will thus contain the difference between the number of coincidences read by the movable head $T_{Mo}$ and that read by the fixed head $T_F$, together with a determination of the sign of the angular separation.

Regulated by a phase-measurement control circuit 15, a circuit 23 receives the two outputs of the anti-coincidence circuit 21 as well as that of the clock 1, in order to measure the mean phase displacement during one revolution of the disc 5 between the coincidences or periods read by the first head $T_F$ and those which are read by the movable head $T_{Mo}$.

A connection is provided between the counting circuit 22 and the phase measurement circuit 23, in order to transmit to the latter particularly information concerning the direction of movement.

The measurement circuit 23 operates by counting clock pulses during the interval of time separating a pulse from the head $T_F$ and a pulse originating from the moving head $T_{Mo}$, or vice versa, according to the information as to the direction of movement.

Regulated by a circuit for adjustment of the origin 16, a digital memory 24 registers a phase displacement at the origin designated by $\phi_o$.

A digital subtractor 26 is coupled with the measuring circuit 23 and the memory 24 to supply the difference between the final phase displacement measured subsequently and the phase displacement at the origin.

By another route, a circuit 27 is traversed by the outputs of certain stages of the reversible counter 22 in order to correct the count by plus or minus one unit, according to the sign of the phase displacement.

FIG. 2 additionally comprises the same circuits once again, now acting on pulses arising from the supplementary movable head $T_{Ma}$ and the fixed head $T_F$. An anti-coincidence circuit 31, a reversible counter circuit 32, a circuit for the measurement of the mean phase displacement 33, a memory of the phase displacement at the origin 34, a circuit for subtracting the phase displacements 36, and a circuit for correction by one unit 37 will again be found.

Finally in FIG. 2 a circuit 18 provides the mean of the accurate measurements originating from the circuits 26 and 36 and of the corrected rough measurements originating from the circuits 27 and 37. All these circuits give digital information; the circuit 18 carries out a simple division by 2 in a manner known in itself.

The digital result of this mean of the two movable heads is displayed in a circuit 19, which thus gives the angular separation corresponding to the common angular displacement of these two movable heads in relation to the fixed head.

In order that the procedure of measurement may be better understood, it will now be described a propos of a topographical theodolite, assuming that it is required to measure the vertical angular separation (for example) between a first sighting position of the lunette, and a second position of the latter.

It should first be remarked that, when the magnetic heads $T_F$, $T_{Mo}$ and $T_{Ma}$ are exactly fixed relative to each other they will read exactly the same number of periods per second. In these conditions, the reversible counters 22 and 23 will oscillate by one unit with respect to their initial value.

For the first position of the lunetter of the theodolite, the phase control circuit 15 is activated together with the circuit 16 for adjustment of the origin. The latter returns the reversible counters 22 and 32 to zero. A mean phase displacement between the pulses arriving from each of the movable heads and those arriving from the fixed head is read (circuits 23 and 33, respectively). Still under the action of the circuit 16 for adjustment of the origin, the memories 24 and 34 register the phase displacements at the origin obtained for the first position of the lunette with the two movable heads, respectively.

Subsequently, the circuits 15 and 16 are switched off and the theodolite is moved from the first to the second sighting position. Thus a relative movement is brought about between the two movable heads and the fixed head. This relative movement produces a difference between the number of subdivisions read by the movable heads and by the fixed head. The difference is registered for each of the two movable heads in the reversible counters 22 and 32, respectively.

When the lunette has reached the second sighting position, the phase measurement control circuit 15, alone, is activated again and a new measurement of the mean phase displacement is carried out by the two measuring circuits 23 and 33.

The subtractors 26 and 36 then produce two phase displacements; the two correction circuits 27 and 37, respectively, take account of their sign.

The circuit 18 takes the mean of the readings of the two heads and circuit 19 finally displays the digital value of the angular displacement of the lunette between its first and its second positions.

It has already been seen that the subdivisions or periods counted by the circuits 22 and 32 and corrected by the circuits 27 and 37, respectively, correspond to 500 seconds of angle.

The measurement of phase difference made by the circuits 23 and 33 is carried out with a resolution equal to 1/1000 of the periods, that is one-half second of angle. The precision is thus of the order of one second of angle.

Certain particularly important circuits of FIG. 2 will now be described in more detail, starting with the anti-coincidence circuit 21. The importance of this circuit arises from the fact that in this embodiment the fineness and the discrimination of the pulses are fundamental since these pulses are the only basis for the measurement of the phase difference. In the subsequent description of the movable head $T_{Mo}$ alone will be discussed but the "o" in the subscript will be omitted since these circuits are also used for the other movable head $T_{Ma}$.

In FIG. 3 the anti-coincidence circuit 21 comprises two inputs, one labelled $T_F$ and originating from the reading circuit for the fixed head 11, the other labelled $T_M$ arising from the reading circuit for the movable head 12.

It will be supposed that one of the pulses, called the anterior, arrives a little before the other, called the posterior, and that they overlap for a little more than half their duration, which is the same for both, in order to describe the mode of operation with reference to FIGS. 3, 3A and 3B.

These two inputs $T_F$ and $T_M$ are first of all applied to a NAND gate 2110 whose output will be low during the possible common part of the two incident pulses (FIGS. 3A and B, line c).

The pulses $T_F$ and $T_M$ are available at the outputs of the AND gates 2111 and 2112, relieved of their common part (FIGS. 3A and B, line d).

The outputs of the two AND gates 2111 and 2112 are applied, respectively, to two monostable circuits 2113 and 2114 having the same delay $T_1$, equal to the duration of the initial pulses $T_F$ or $T_M$. These monostable circuits are arranged in such a way that their output continues for this delay $T_1$ starting from the rising front of their input signal (FIGS. 3A and 3B, line e).

The outputs of the two monostable circuits 2113 and 2114 are connected, respectively, to AND gates 2115 and 2116, which receive by another route the signal $T_F$ and the signal $T_M$, respectively.

The AND gates 2115 and 2116 give the following result: the pulse arriving first is practically unmodified while that which arrives second is again reduced to the part which is not common with the first (line f).

A monostable circuit 2117 prolongs, also by the pulse duration $T_1$, the common part, complemented by the inverter 2120 after the output of the NAND gate 2110 (lines g and h). The non-common parts of the pulses $T_F$ and $T_M$ arriving from the gates 2111 and 2112 are applied to NAND gates 2118 and 2119, which also receive in common the output of the monostable circuit 2117. The one of these gates which remains at the level "1" indicates the first of the two pulses $T_F$ and $T_M$ to arrive (line i).

AND gates 2121 and 2122 make it possible to select this first pulse to arrive (line j), starting from the outputs of the gates 2115 and 2116.

After complementation by the inverters 2123 and 2124, other AND gates 2125 and 2126 make it possible to select the second of the pulses to arrive (line k).

Delay elements 2140, 2141, 2142 and 2143 may be interposed as shown in FIG. 3, in the path which the pulses $T_F$ and $T_M$ follow before arriving at the AND gates 2125 and 2126. These delay elements make it possible to achieve improved functioning of the anti-coincidence circuit by eliminating the formation of parasitic pulses of short duration.

A monostable circuit 2127 is coupled to the output of the NAND gate 2110 to receive the common part of the two incident pulses. At its output is delays the beginning of the negative-going pulse edge by a value $T_2$, which causes the low level to comprise only a final fragment of the common part (line l of FIG. 3A).

This output of the monostable 2127 is applied to two AND gates 2128 and 2129 receiving by another route the outputs of the AND gates 2121 and 2122. Thus the first of the pulses to arrive will pass towards the OR gate 2151 for $T'_F$ (or the gate 2152 for $T'_M$). This first pulse will have its final part amputated because of the action of the monostable circuit 2127 with delay $T_2$ (line m of FIG. 3A).

The pulse which arrives second is given by the gates 2125 and 2126. An AND gate 2130 indicates whether the two incident pulses coincide almost exactly.

If they do not coincide, the inverter 2131 enables an AND gate 2132 and the second pulse passes through one of two gates 2133 or 2134 according to whether it is $T_F$ or $T_M$, these two gates receiving the output of the monostable circuit 2135.

The monostable circuit 2135, starting from the complemented common part produced by the gate 2110, produces a slightly shorter common part of fixed duration $T_3$, greater that the duration $T_2$ above (line l of FIG. 3B).

In consequence, the pulse which arrives second is not able to pass until after the end of the pulse which arrives first, defined by th monostable circuit 2127 of duration $T_2$ (compare line m of FIGS. 3A and 3B).

When the two incident pulses are completely separate there is no common part and pulses such as those at the outputs of the AND gates 2121 and 2122 are again found while the AND gates 2125 and 2126 remain at the low level.

Not having been triggered, the monostable circuit 2127 (duration $T_2$) sanctions the two gates 2128 and 2129 to allow passage of the pulses each in its turn.

Finally, in the case in which the pulses almost coincide the two gates 2121 and 2122 will maintain their output at the low level, the pulses $T_F$ and $T_M$ then pass through the AND gates 2125 and 2126 and the AND gate 2130 is excited during the two simultaneous pulses.

The pulse $T_F$ is then forced to go ahead by means of the AND gate 2137 which applies the start of the duration $T_2$ of the commn part, given by the monostable circuit 2127, to the OR gate 2151 giving $T'_F$.

As before, the AND gate 2134 reacts at the output of the monostable circuit $T_3$ 2125 to produce a pulse $T_M$, separate in time, which is applied to the OR gate 2152.

There are thus three modes of operation:
when the two incident pulses are completely separate in time, the anti-coincidence circuit leaves them thus,
when the two incident pulses have a common part, without being almost completely coincident, they are separated authoritatively by means of the monostable circuits $T_2$ and $T_3$,
when the pulses coincide almost entirely or entirely the pulse $T'_F$ is forced to become the first and a short pulse $T'_M$, clearly separate, is made to follow.

Figure 4:
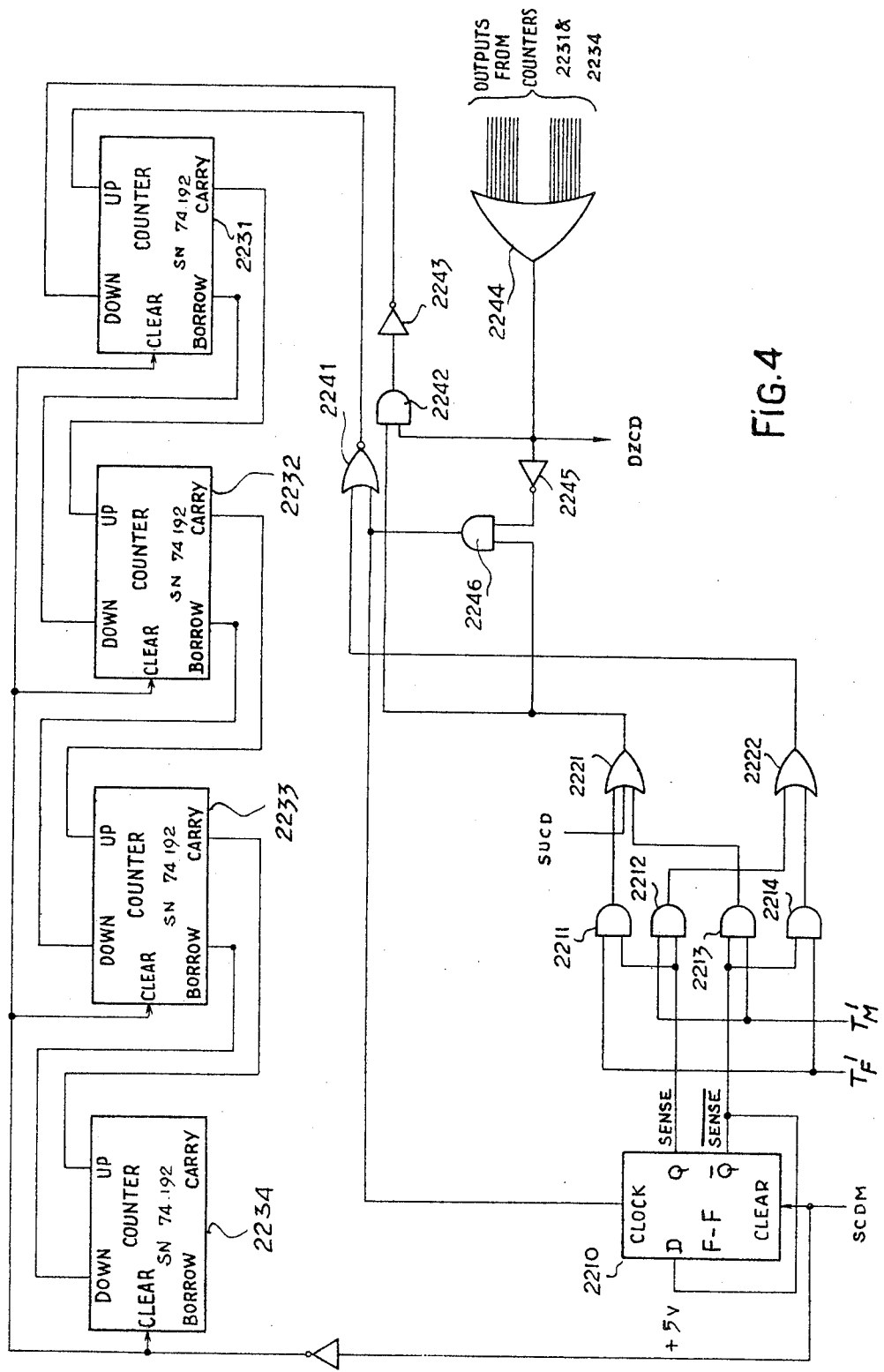
FIG. 4 is a detailed circuit diagram of the circuit 22 for the differential counting of the periods of FIG. 2.

FIG. 4 illustrates an embodiment of the bidirectional counter circuit 22 of FIG. 2; this circuit is also concerned with the detection of the direction of rotation, that is with the sign of the angular displacement.

The circuit of FIG. 4 receives the pulses $T'_F$ and $T'_M$ arriving from the anit-coincidence circuit 21 of FIG. 3. A bistable circuit 2210 gives information of the direction of movement (SENSE) in a maner which will be described later.

According to that state of the outputs Q and $\overline{Q}$, of the bistable 2210, the lines $T'_F$ and $T'_M$ are applied directly or inversely to OR gates 2221 and 2222 through four AND gates 2211 to 2214.

The outputs of the two OR gates 2221 and 2222 are applied through logical gates 2241 to 2243 to a series of four integrated bidirectional counter circuits in binary-coded decimal (BCD) format which have the reference numbers 2231 to 2234. Series connection of the counting (UP) and count-down (DOWN) inputs, and the carry (CARRY) and borrow (BORROW) outputs of these integrated circuits is carried out in a manner known in itself. In FIG. 4 this arrangement is effected with integrated circuits S N 74,192, sold by TEXAS INSTRUMENTS.

In order to simplify FIG. 4, the four stage outputs of each of the integrated circuits which go downstream in FIGS. 2 and 5 have not been illustrated.

These integrated circuits, as well as the bistable 2210, are reset to zero by a signal SCDM, or adjustment signal, at the start of the measurement, supplied during the activation of the circuit 16 for the adjustment of the origin of FIG. 2.

The OR gate 2221 has a supplementary input designated by SUCD, which receives a signal for the subtraction of one unit of the bidirectional counter supplied by the circuit 27 for correction by one unit in FIGS. 2 and 5. A pulse SUCD appearing at the OR gate 2221 is transmitted to the DOWN input of the first counter 2231 to substract one unit from its contents.

The zero of the assembly of outputs of the counters 2231 to 2234 is detected by an OR gate 2244 which supplies a signal DZCD of detection of zero of the counter 22. The signal DZCD is a logical zero while all the outputs of the counter 22 are on ZERO. It permits the bistable D 2210 to be caused to change state by the application of a pulse on its CLOCK input when the first pulse after the arrival of the zero of the counter 22 is a pulse intended to be counted down. The inverter 2245 and the AND gate 2246 allow this last condition to be realised.

The counting pulses transmitted by the OR gate 2222 are normally inverted in a NOR gate 2241 in order to be counted at the UP input of the circuit 2231. In the case above, in which the signal DZCD is at zero and where the first pulse appearing is a pulse intended in principle to be counted down, this pulse is in fact applied at the counting UP input of the circuit 2231 by the AND gate 2246, enabled by the inverter 2245 and by the NOR gate 2241.

The counting down pulses transmitted by the OR gate 2221, or the pulses SUCD for subtraction of one unit, are transmitted to the DOWN input of the first counter 2231 by an AND gate 2242, disabled by the passage to zero of the counter 22 DZCD and by the inverter 2243.

In summary, the bistable 2210 will contain an information (SENSE) of the direction of displacement between the movable head $T_M$ and the fixed head $T_F$, that is to say of the sign of the angle. It will change state during the passage through zero of the counter if the first pulse to follow is a count-down pulse. The pulses $T'_F$ and $T'_M$ are then directed towards the UP input or towards the DOWN input of the counter 2231.

The initial sign of the contents of the counter 22 can be defined arbitrarily, or forced by causing the movable head $T_{Mo}$ to pass in front of the fixed head in the desired direction within one subdivision.

If the head $T_M$ is displaced relative to $T_F$ in the direction of rotation of the disc, the bidirectional counter, which receives +1 for each positive pulse read by $T_F$ and +1 for each pulse read by $T_M$, moves between zero and +1. In this case, the measurement of phase has the sign + (plus) and it will commence from $T_F$.

In the opposite direction of displacement, the counter moves between zero and −1. The sign − (minus) is then given to the measurement of phase, which starts from $T_M$.

After the angular displacement, according to whether the count of the bidirectional counter is finally positive or negative, the final measurement of phase is made with reference to the fixed magnetic head $T_F$ or to the movable magnetic head $T_M$.

In FIG. 5 there are illustrated together, on the one hand, the circuit 23, above the dashed line, and, on the other hand, the circuit 22 already described, the memory 24 for phase at the origin, the subtractor 26, and the correction circuit 27.

In the circuit 2315 a signal DICD is produced which changes state at the end of each UP or DOWN pulse such as is applied to the first circuit 2231 of the bidirectional counter. For example, it is prescribed that the signal DICD should commence by a passage to the level ONE at the end of an UP pulse.

The counting of 2592 periods is then carried out, starting from this signal DICD, counting all its transitions in the same direction.

For this purpose the circuit 2315 comprises a modulo-2592 counter. When it has counted 2592 it indicates that the determination of phase displacement has been carried out.

In fact, the circuit 2315 for counting the periods comprises an output line SDD2 which forbids the production of phase displacement pulse edges at the output of the circuit 2311, outside the counting of the 2592 periods.

The beginning of the periods is given by a signal VDMP for enabling the measurement of phase arising from the control circuit 15 for phase measurement of FIG. 2. In response to this signal, the circuit 2315 also produces a command SDD3 which resets to zero the counter-accumulator 2314, which counts the mean phase displacement $\phi_M$ between the up and down counting pulses.

Finally, this counting circuit 2315 receives the signal SCDM for adjustment at the start of measurement as already described, arising from the circuit for adjustment of the origin 16 of FIG. 2. It registers this signal SCDM at least until the end of counting and then produces an output signal SDD1 after the end of the counting of 2592 periods (one revolution of the disc).

In the presence of the signals VDMP and SDD2, the circuit 2311 produces phase displacement pulses. For this purpose it produces three separate signals CDA1, CDA2 and CDSA, utilising the signals UP, DOWN and DICD.

In fact, the signal DICD makes it possible to see whether the UP and DOWN pulses (that is $T'_F$ and $T'_M$) arrive alternately all the time, that is the one for one state of the signal DICD and the other for the complementary state of this signal.

Supposing first of all that the UP and DOWN pulses arrive alternately from the beginning of the measurement of phase (signal VDMP), the circuit 2311 produces a signal CDA1 comprising a pulse ONE for each interval of time between the end of a pulse UP and the end of the pulse DOWN which follows it immediately.

This signal CDA1 is, moreover, identical with the signal DICD in this case.

It will be seen below that the signal CDA1 is expressed as a measurement of time with the sign + (plus) and the coefficient 1.

Directly the alternation of the UP and DOWN pulses is interrupted things take place differently.

If two DOWN pulses appear consecutively, a signal CDS1, constituted by a pulse edge is produced only between the end of the DOWN pulse and the UP pulse which follows it, and thus in succession until two consecutive UP pulses reestablish the initial alternation.

The signal CDS1 is expressed as a measurement of time with the sign − (minus) and the coefficient 1.

If, finally, two consecutive UP pulses appear after the normal initial alternation, the signal CDA1 is produced just the same but it is then inverted: the pulse CDA1 is placed between the two consecutive UP pulses, then between the DOWN pulse and the UP pulse which follows and thus in succession until two consecutive DOWN pulses re-establish the initial alternation. There the signal CDA1 remains identical with the signal DICD in spite of the interruption of the alternation.

In addition, there is also produced a signal CDA2 which corresponds to a measurement of time with the sign + and the coefficient 2.

This signal CDA2 comprises a pulse for each interval of time between an UP pulse and a DOWN pulse which follows it immediately, this of course only during the duration of the anomaly.

The combination of the signal CDA1 and the signal CDA2 allows a measurement corresponding to reality to be obtained in spite of the anomaly, by counting twice those parts of the real pulse which overlap.

A logical gate 2312 allows the signals CDS1, CDA2 arising from the circuit 2311 for producing phase displacement pulses to be transmitted to a divider-by-2592 assembly designated by 2313. The logical gate 2312 receives the clock signals at 23.976 MHz and the counter 2312 divides this frequency by 2592 during the pulses CDA1 and divides it by 1296 (2592 ÷ 2) during the pulses CDA2 in order to produce a first output signal SDA 2592 associated with the sign +. The counter 2313 also divides the clock frequency by 2592 during the pulses CDS1 to produce a second output signal SDS 2592 (associated with the sign −). The signals SDS 2592 and SDA 2592 are received by the up and down count inputs of the counter of mean phase displacement $\phi_M$ designated by 2314.

In response to the signal SDD1, the memory of phase at the origin 24, initially set to zero by the signal SCDM, registers the contents of the counter 2314. The memory 24 then contains the phase at the origin which it applies to the subtractor 26, operating in binary-coded decimal format.

Upon a subsequent activation of the circuit 15 a new signal VDMP is produced, the period counter 2315 functions again, sanctioning the operation of the circuit 2311 for production of phase difference pulses. After 2592 periods, the counter 2314 contains the final mean phase difference which is applied to the other input of the BCD subtractor 26.

The BCD subtractor 26 then supplies at its output the mean difference in phase between the final position and the initial position.

Since the clock frequency is a thousand times greater than the frequency of registration of the subdivisions on the disc, measurement of the phase difference is carried out with a precision of one one-thousandth. For this reason the subtractor 26 comprises four BCD decades.

This BCD subtractor acts for example by renewed addition of the complement, taking into account a unit lacking at the level of the least significant bit. However, when the SENSE (direction) changes between the memorised phase at the origin and the measured phase $\phi_M$, the two values are simply added.

The circuit for correction by one unit 27, intended to correct the contents of the bidirectional counter 22, receives the carry and borrow outputs of the counter 2314 of the mean phase $\phi_M$ to determine the sign of the latter and to apply the correction according to this sign.

The circuit 27 also receives a signal from the BCD subtractor 26; it is also informed of the fact that the bidirectional counter 22 passes through zero (signal DZCD) as well as of the adjustment signal at the beginning of measurement SCDM.

From these various signals the correction circuit 27 builds up a signal for the subtraction of one unit from the bidirectional counter SUCD, which is applied directly to the DOWN input of the first stage 2231 of the bidirectional counter 22.

Once this correction has been made, the circuit 18 of FIG. 2 produces the mean of the measurements made by the movable head $T_{Mo}$ and by the movable head $T_{Ma}$. This circuit 18 carries out a division by 2 in binary-coded decimal format, in a manner known in itself.

Finally, the circuit 19 displays the final angular difference, with seven figures of decimals plus the sign.

Of course, for application to theodolites, two angle coders are used, one for vertical angles and the other for horizontal angles. The electronic circuits can obviously comprise common parts, particularly the clock 1, the circuits for adjustment of origin 16, and the control circuit 15 of FIG. 2. In practice, these two circuits can be activated by hand by means of push buttons and/or directly by means of the angular clamping members of the theodolite.

In a variant of the embodiment, the synchronous motor controlled by the frequency source is replaced by a motor, preferably a d.c. motor, controlled and serviced to conserve the time precision of the coincidences, for example the regularity of reading of the subdivisions by the fixed head. In the measurement of the regularity of spacing of these subdivisions during their inscription a practically constant speed of rotation of the disc is thus obtained.

Of course, the method of magnetic detection of the reference mark on the rotating disc in not absolutely necessary; optical detection also allows a high precision of measurement; it is possible, for example, to employ photoelectric elements in place of the magnetic heads $T_F$, $T_{Ma}$ and $T_{Mo}$, and black and white lines inscribed on the rotating disc.

In fact, the preferred variant which will now be described with reference to FIGS. 6 and 7 comprises an optical method of reading.

As will be seen on inspecting FIG. 6, the group of which each indicator comprises a series of reference marks is once again that which is not assigned to the definition of the angle to be measured, that is the second group mentioned above.

In FIG. 6, the reference 40 denotes a pillow block forming part of a construction illustrated very schematically by the broken line 41.

The construction 41 carries the first indicator which comprises first of all two principal reading members TFO and TF180 for accurate measurement and an auxiliary reading member T1 for rough measurement.

The second indicator is connected to a shaft 42 rotating within the pillow block 40. The rotation of the shaft 42 relative to the pillow block 40 connected to the construction 41 will give the angle to be measured.

The shaft 42 is rigidly connected to a radial element which supports two principal reading members TMO and TM180, intended for accurate measurement, as well as an auxiliary reading member T2 for rough measurement.

A disc 50, which absorbs light and which is thus of low or zero reflectivity, is driven by a motor 55 in rotation about an axis substantially coincident with the axis of rotation of the shaft. Although this coincidence is brought about as exactly as possible there is a residual divergence and it is necessary to distinguish between the first axis of rotation about which the shaft 42 undergoes angular displacement and the second axis of rotation about which the disc 50 is rotated.

The disc 50 carries two principal indicators constituted by two series of engraved reflecting marks distributed in a regular manner about its axis of rotation. These two series of marks form two tracks 51 and 52. Advantageously, but not necessarily, the marks of the two tracks are engraved at the same time on the same radius of the disc.

In a particular embodiment, these marks number 2,000 and the disc has a diameter of about 6 cm. The techniques of engraving of lines employed at the present time in precision optics allow 2,000 lines per rotation on a circle of about 5 cm diameter, or 15.5 cm circumference, to be achieved, corresponding to a density of engraving of about 13 lines per mm. The breadth of the lines is preferably comprised between a half and a tenth of the interval between adjacent lines, for example equal to one quarter of the interval.

The disc 50 also comprises two auxiliary marks 53 and 54, arranged on separate tracks and comprising one mark per revolution. Here again, it is advantageous, but not necessary, that the marks should lie on the same radius.

The disc is rotated at a speed of 2.5 revolutions per second; the frequency corresponding to one mark per revolution is 2.5 Hz for the tracks 53 and 54 and is 2,000 times greater, or 5,000 Hz, for the tracks with 2,000 marks distributed regularly and denoted by the references 51 and 52.

The reading head TFO comprises a photo-emitting element 420, a grid 421, and a photo-receiving element 422. An axial line extends in FIG. 6 from the reference number TFO to the elements 420, 421 and 422. The axial line ends in the lower region of the track of marks 51 and indicates the cooperation of these elements with each other.

The reading head TF180 is constituted in an analogous manner but, as is shown by the axial line which concerns it, it is assigned to another region of the track 51, which is diametrically opposite to the region assigned to the reading head TFO.

In addition, an auxiliary reading head T1 is mounted at the side of the principal head TFO so as to be able to read the mark of the track 53. The auxiliary reading head T1 is constituted like the reading head TFO, except that its grid 425 is formed by a simple narrow transparent, equivalent to a slit. For reasons of uniformity of manufacture, an analogous slit 426 is arranged in the same way close to the grid 423 assigned to the reading head TF180. This supplementary grid 426 may serve, for example, to mount a second auxiliary reading head if required or as a safeguard.

The second indicator is constituted in the same manner by a principal reading head TMO acting in conjunction with the set of marks 52; at the side of the reading organ TMO is mounted an auxiliary reading head T2 acting in conjunction with the mark 54. Diametrically opposite to the reading head TMO in relation to the axis of rotation of the shaft 42, the other principal reading head TM180 acts in conjunction with part of the track 52 which is diametrically opposite to that part of the same track which concerns the movable reading head TMO.

Thus, by construction, the movable heads TMO and TM180 are mounted practically symmetrically with respect to the first axis of rotation about which the shaft 42 undergoes an angular displacement. As is indicated by the double-headed arrow 427 situated in the neighbourhood of its support 428, the fixed head 180 is adjustable in position. Adjustment is carried out during construction (and where necessary revised later) so that the fixed head TF180 is also practically symmetrical with the fixed head TFO in relation to the first axis of rotation. Experience has shown that the use of two fixed heads for accurate measurement, TFO and TF180, mounted diametrically opposite to one another as are the two movable heads for accurate measurement, TMO and TM180, results in a considerable improvement in precision.

Of course, FIG. 6 is a view before assembly in which the parts have been separated to allow better understanding. In reality, the grids of the fixed heads such as 421, 423 and 425, as well as the grids of the movable heads such as 431, 433 and 435, are arranged in the immediate neighbourhood of the series of marks on the disc 50 with which they are intended to cooperate. It will be observed that, in this way a very compact construction of the mechanical part of the device for digital coding of angles is achieved.

The electronic part of the coder in its preferred variant will now be described in detail with reference to FIG. 7.

In the first place, it will be seen that the inputs of this electronic part are constituted by the output connections of the reading heads.

By way of example, the photo-emitting organs can be constituted by electroluminescent diodes TIL 23 or 24 marketed by TEXAS INSTRUMENTS; the photo-receiving elements may be phototransistors LS 600 also marketed by TEXAS INSTRUMENTS, or else of the type BPX 71-C marketed in France by RTC-LA RADIOTECHNIQUE COMPELEC.

These elements are fed in the usual manner well known to one skilled in the art and are supplied with adequate optical systems which may be those of the manufacturer.

The circuits 61, 62, 71, 72, 81 and 82 are those coupled with the photo-receptive elements.

The grids, such as 425 and 435, simply form the equivalent of a slit, as seen above. The tracks 53 and 54 carry at least one mark, and the coincidence is produced by the passage of this mark across the slit. As a result one pulse appears, for each coincidence at each revolution, at the output of the circuits 61 and 62 of FIG. 7, which are assigned, respectively, to the auxiliary fixed reading head T1 and the auxiliary movable reading head T2.

The grids such as 421, 423, 431 and 435 comprise, for example, the equivalent of about twenty consecutive marks of the tracks 51 and 52, respectively, engraved in the same manner.

When the series of marks is in exact coincidence with the grid, a large part of the light produced by the photo-emitting element passes through the grid and is absorbed or transmitted by the disc 50. Thus, only a small fraction of the light is reflected and seen by the photo-receptive element because of the fact that the marks on the disc are in coincidence with those on the grid. When, owing to relative rotation, the series of reflecting marks on the disc moves progressively out of coincidence with that on the grid, the fraction of reflected light received by the photo-receptive element increases, to become substantially constant when each mark of the track is situated exactly between two marks on the grid. Coincidences will thus be given for the minimum in the light received by the photo-receiving element when the series of marks of the track coincides with that of the grid.

The fact that grids such as 421 and 423, which comprise about twenty marks, are used, although one mark would suffice in principle, has the effect of improving the signal-to-noise ratio at the output of the photo-receptive element, while at the same time ensuring a type of weighting, which partly compensates for individual variations in the positions of the marks.

The coincidences produced, as has just been described, by the heads intended for accurate measurement are available in the form of electrical signals at the output of the circuits 71 and 72 of FIG. 7, for the fixed heads TFO and TF180 respectively, and at the outputs of the circuits 81 and 82 for the movable heads TMO and TM180, respectively.

In FIG. 7, the output of circuit 61 for reading the fixed head T1 is utilised first in a circuit 70 for detecting rotation, which is to act as the sanctioning means to define one revolution of the relative rotation. This circuit comprises one or more bistable circuits mounted so as to change state in response to the coincidences of the fixed head T1. Between a first and a second coincidence, the circuit 70 will define a state of the output "first revolution" on an output line connected to AND gates 710 and 810 which also receive the outputs of the reading circuits 71 (fixed head TFO) and 81 (movable head TMO).

Between the second and the third coincidences seen by the fixed head T1, the circuit 70 will define a state of the output "second revolution" applied to AND gates 720 and 820 connected, respectively, through another route to the output of the reading circuit 72 (fixed head TF180) and to that of the reading circuit 82 (movable head TM180).

The outputs of the AND gates 710 and 720 are connected to an OR gate 73, while the outputs of the AND gates 810 and 820 are connected to an OR gate 83.

The circuit 70 thus produces a sort of multiplexing, the heads TFO and TMO being utilised during a first revolution, and the heads TF180 and TM180 being utilised during a second revolution. The operation is here limited to two revolutions and the mean of the phase differences between coincidences is carried out during these two revolutions, as will be seen below. Such a process could equally be repeated thus giving several mean measurements in succession. It is also possible to cause the device to function for 2.p revolutions, taking the mean over these 2.p revolutions.

Now, considering the output of the OR gate 73, it appears that this comprises coincidences which are a faithful reproduction of the rotation of the disc 50, the coincidences being obtained sometimes from the reading head TFO and sometimes from the reading head TF180.

These coincidences are used to pilot a clock 80 (of the type VCO, that is an oscillator controlled by a potential difference) fitted with a phase control loop. In this way, and according to a particularly interesting characteristic, the clock used for the measurements of delay between coincidences is not an extremely precise clock in time, but rather a clock enslaved with respect to the rotation of the disc 50. Rotation of the disc 50 is, of course, carried out at a substantially fixed speed, for example by means of a d.c. motor, but irregularities or "drifts" which may appear in the movement of the disc 50 are reverberated by the clock 80 which thus shows to a certain degree a special time defined with respect to the rotation of the disc 50. This arrangement contributes greatly to improvement in the precision.

Now returning to the circuits 61 and 62, assigned respectively to the fixed head T1 and the movable head T2, the outputs of these heads are applied to a circuit 63, which will define a rough measurement pulse. For this purpose, the circuit 63 comprises, for example, a bistable circuit, put into one state by the output of the circuit 61, and into the other by that of circuit 62.

One state of the outputs of this bistable will give, as output of the circuit 63, a rough measurement pulse edge which is applied to an AND gate 64, which receives a frequency of 10 kHz derived from the clock 80, as well as the output of a circuit 65 for enabling measurement of angle.

For reasons which will be described below, the output of circuit 63 is also applied to an AND gate 66, which receives a frequency of 100 kHz from the clock 80, as well as the output of an enabling circuit 67. Only one of the gates 64 and 66 is enabled at one time.

In the operation of precise angle measurement, the circuit 65 enables the gate 64, the output of which, through an OR gate 69, arrives at a counter 90 which will contain the rough measurement. In fact, during the rough measurement pulses, defined by the circuit 63, the counter 90 receives from the AND gate 64 pulses at 10 kHz (enslaved). Counting of these pulses defines the rough measurement.

From another side, a circuit 75 receives the output of the OR gates 73 and 83, in order to define accurate (fine) measurement pulses. These pulses or pulse edges concern the interval between the coincidences read by one of the fixed heads TFO and TF 180 and the coincidences read by one of the movable heads TMO and TM180.

These pulses present themselves at an output + +, at an output +, or at an output − of the circuit 75, according to a pre-established choice of signs. This choice of signs corresponds to the fact that the coincidence of the fixed heads (first indicator) is produced before the coincidence of the movable heads (second indicator), or vice versa. Of course, the choice of sign is arbitrary, but fixed by the construction. The output + + corresponds to an overlapping of pulses (ambiguity).

The outputs + +, + and − of the circuit 75 are applied, respectively, to AND gates 80, 76 and 77, each receiving by a different route the same signal at 10 MHz arising from the clock 80.

The outputs of the gates 80, 76 and 77 are applied to dividers by 4,000, reference numbers 78 and 79, respectively. The output of the gate 80 is applied to the input of the second bistable of the counter 78 (input x 2). As there are 2,000 marks per revolution, these counters take the mean of the delays between adjacent coincidences over a first revolution between the heads TFO and TMO, and over a second revolution between the heads TF180 and TM180.

The outputs of the counters 78 and 79 are applied, respectively, to the up and down count inputs of a bidirectional counter 91. At the end of the two revolutions defined by the circuit 70, the count of circuit 91 thus defines the accurate measurement as a mean, as was stated above.

The circuit 75, with the gates 80, 76 and 77 and the divisors 78 and 79 is constructed like the circuit 2311 with the gate circuit 2312, and the divisior circuit 2313 as described above in relation to FIG. 5: the inputs arising from the gates 73 and 83 correspond to the UP and DOWN inputs of circuit 2311; the outputs of the counters 78 and 79 correspond to output signals SDA 2592 and SDS 2592 of the circuit 2313. In fact, if the anti-coincidence circuits are no longer as complex as before, auxiliary indicators defining an absolute references; the "lifting of ambiguity" is always effected.

As before also, a correction circuit 92 is interposed between the circuit 91 for accurate measurement and the counter 90 for rough measurement in order to correct the latter by one unit when the counting of accurate measurement reveals an error which has occurred in the rough measurement.

Finally, the outputs of the counters 90 and 91 are applied to a decoding and digital display circuit 95. Decoding can be carried out permanently but the display is multiplexed by an AND gate 94 at a frequency of 1 kHz arising from the clock 80 and under the control of a circuit for enabling display 93, which can be activated either by the circuit 65 for enabling measurement of angle or by the circuit 67 for enabling angular positioning.

The operation which has been described with reference to FIG. 7 corresponds to an accurate measurement of angle carried out over two revolutions. The circuit 65 carries out the necessary enabling operations as well as the different resettings of state necessary, in particular resetting to zero of the circuit for detection of one revolution 70 and of the counters 78, 79, 90 and 91. After two revolutions, the measurement of angle is displayed by the circuit 95. The electronic circuits can then be left waiting for a new manual command for the measurement of angle, or else they can function similarly repetitively under the control of circuit 65, for example.

An application other than to the measurement of angle may be of interest; precise angular setting of position. For this purpose, the circuits 66, 67 and 68 are advantageously used. In fact, since accurate measurement occupies a certain time, it would be tiresome to carry out several accurate measurements in succession before arriving at exactly the desired angular position. For this purpose, the circuits 66, 67 and 68 allow a "less rough" measurement to be carried out which allows a preliminary position for the setting to be determined; and, above all, this less rough measurement is carried out without interruption. The enabling circuit 67 locks the circuit for detection of one revolution 70 in its "first revolution" state and the assembly of circuits of accurate measurement is inhibited, the clock 80 being piloted from the fixed head TFO. During the rough measurement pulses 63, a frequency of 100 kHz taken from the clock 80 is applied to a counter 68, of modulus 10, which, through the OR gate 69, feeds the rough measurement counter 90. Since the clock frequency is here 100 kHz, the measurement obtained in this way is more precise, and finally the circuit 67 for enabling positioning acts on the circuit 93 for enabling display, in order to allow display of the rough measurement by the circuit 95. It will be easily understood that this rapid operation (400 m/sec.) and, above all, the continual repetition is much more advantageous when it is desired to approximate as closely as possible to a precisely defined angular position, before obtaining this position exactly making one or more complete accurate measurements (each of which takes about one second).

While the angle coder described with reference to FIGS. 1 to 5 is of the absolute type for accurate measurement, ambiguous but relative, that is to say measuring an angular displacement, for the rough measurement, that of the embodiment which has just been described with reference to FIGS. 6 and 7 is truly an absolute angle coder: it can give the angle without ambiguity in any position whatever, and while giving an effective precision 0.01 centigrade.

Of course, this absolute coding can be transformed into relative coding by introducing an intitial value, by means of coding wheels on the parallel inputs of the counter 90 of rough measurement and on those of the counter 91 of accurate measurement.

In its preferred variant, the coder is particularly applicable to theodolites, in the same way as indicated above with reference to the coder of FIGS. 1 to 5.

We claim:

1. In a digital angle coder comprising:
first and second angle defining members which are relatively rotatable about a first axis of rotation and the angular shift of which is to be detected,
an auxiliary revolving member driven in continuous rotation at a substantially constant speed about a second axis of rotation substantially coinciding with said first axis of rotation,
a coding means and code-reading means arranged for cooperation between said angle defining members and said auxiliary rotating member, one of said coding and code-reading means being arranged on said auxiliary revolving member and the other of said coding and code reading means being arranged on each of said angle defining members, said coding means comprising at least one plurality of fine markings regularly spaced about the axis of rotation of the member carrying said coding means and at least one coarse marking, and said code-reading means is adapted to read said fine markings to provide repetitively first and second read fine marking signals relating to said first and second angle defining members, respectively, and is adapted to read said at least one coarse marking during each rotation of the member carrying the coding means to provide coarse marking signals,
fine angle detection means including means for producing time-shift signals corresponding to the time-shifts between each of the first read fine marking signals and the associated one of the second read fine marking signals, means for deriving from said time-shift signals a fine value signal representative of the angle between said first and second angle defining members, coarse angle detection means responsive to successive coarse marking signals for producing a coarse value signal representative of the angle between said first and second angle defining members, and means for combining said fine value and coarse value signals into a digitally coded representation of the angle between said first and second angle defining members, the improvement of said means for deriving a fine value signal including means for averaging the time-shifts represented by said time-shift signals over one or more complete revolutions of said auxiliary revolving member, whereby the angle measurement is rendered very accurate by compensation of inequalities in the angular spacing of the markings.

2. A digital angle coder according to claim 1, wherein said averaging means includes a clock for fine measurement, counter means capable of being coupled to said time shift signals for accummulating a count of said clock, representing the durations of said time shift signals, and authorization means for coupling said time-shift signals to said counter means during one or more complete revolutions of said revolving member.

3. In a digital angle coder comprising:

first and second angle defining members which are relatively rotatable about a first axis of rotation and the angular shift of which is to be detected, an auxiliary revolving member driven in continuous rotation at a substantially constant speed about a second axis of rotation substantially coinciding with said first axis of rotation, coding means arranged on said auxiliary revolving member and comprising at least one plurality of fine markings, regularly spaced about the axis of rotation thereof, and at least one coarse marking, code reading means arranged on each of said first and second angle defining members and adapted to read said fine markings to provide repetitively first and second read fine marking signals relating to said first and second angle defining members, respectively, and is adapted to read said at least on coarse marking during each rotation of the member carrying the coding means to provide coarse marking signals, fine angle detection means including means for producing time-shift signals corresponding to the time shifts between the first read fine marking signals and the associated second read fine marking signals, means for deriving from said time-shift signals a fine value signal representative of the angle between said first and second angle defining members, coarse angle detection means responsive to successive coarse marking signals for producing a coarse value signal representative of the angle between said first and second angle defining members, and means for combining said fine value and coarse value signals into a digitally coded representation of the angle between said first and second angle defining members, the improvement of said means for deriving a fine value signal including means for averaging the time-shifts represented by said time-shift signals over one or more complete revolutions of said auxiliary revolving means, whereby the angle measurement is rendered very accurate by compensation of inequalities in the angular spacing of the markings.

4. A digital angle coder according to claim 3, wherein said averaging means includes a clock for fine measurement, counter means capable of being coupled to said time-shift signals for accumulating a count of said clock, representing the durations of said time-shift signals, and authorization means for coupling said time-shift signals to said counter means during one or more complete revolutions of said revolving member.

5. A digital angle coder according to claim 4, wherein said code reading means is further adapted to provide from said coarse marking at each revolution of said revolving member first and second coarse marking signals relating to said first and second angle defining members, respectively.

6. A digital angle coder according to claim 5, wherein said authorization means is coupled to one of said first and second coarse marking signals to define therefrom said one or more complete revolutions.

7. A digital angle coder according to claim 5, wherein said coarse angle detection means further comprises means for coarse angle measurement coupled to said first and second supplementary read marking signals, to define therefrom a coarse measurement within one revolution of the angle between said first and second angle defining members.

8. A digital angle coder according to claim 7, wherein said means for coarse angle measurement comprises means for counting pulses at a frequency which is a submultiple of that of said fine measurement clock, during the time-shift between said first and second coarse marking signals.

9. A digital angle coder according to claim 5, wherein said code reading means includes a first pair of code reading members and a first supplementary code reading member arranged on said first angle defining member, and includes a second pair of code reading members and a second supplementary code reading member arranged on said second angle defining member, the code reading members in each pair being substantially symmetrical with respect to the first axis of rotation, and wherein said coding means on the revolving member includes two pluralities of fine markings equal in number and substantially regularly spaced about the axis of rotation thereof and selectively readable by said first and second pairs of code-reading members, respectively, and two coarse markings each readable once per revolution by a respective one of said first and second supplementary code reading members.

10. A digital angle coder according to claim 3, wherein said code reading means comprises several reading members regularly spaced about the axis of rotation associated therewith and adapted to read the same markings.

11. A digital angle coder according to claim 4, further comprising means coupled to one of said first and second read fine marking signals for enslaving the said fine measurement clock according to the repetition rate of read marking signals.

12. A digital angle coder according to claim 3, wherein said revolving member is a disc made of a low reflectivity material, said coding means is in the form of a series of reflecting marks substantially regularly spaced around said disc, and said code reading means comprises code reading members each including a grid corresponding to the marks to be read, a photoemissive cell and a photo-receptive cell mounted for producing a read-marking signal at each coincidence of the grid and the marks.

13. A digital angle coder according to claim 7, further including means for displaying digital information combining the said coarse measurement and the said fine measurement constituted by the output of the means of determination of the mean phase displacement.

* * * * *